United States Patent [19]
Yoshino et al.

[11] Patent Number: 5,293,519
[45] Date of Patent: Mar. 8, 1994

[54] RF COIL FOR A NUCLEAR MAGNETIC RESONANCE IMAGING DEVICE

[75] Inventors: Hitoshi Yoshino; Hiroyuki Takeuchi, both of Kashiwa, Japan

[73] Assignee: Hitachi Medical Corporation, Tokyo, Japan

[21] Appl. No.: 669,960

[22] Filed: Mar. 15, 1991

[30] Foreign Application Priority Data

| Mar. 20, 1990 | [JP] | Japan | 2-068429 |
| Jun. 26, 1990 | [JP] | Japan | 3-165797 |
| Jul. 9, 1990 | [JP] | Japan | 2-179690 |

[51] Int. Cl.⁵ .................................. G01R 33/20
[52] U.S. Cl. ..................... 324/318; 324/322
[58] Field of Search .............. 324/300, 307, 309, 318, 324/322; 128/653 SC

[56] References Cited

U.S. PATENT DOCUMENTS

| 4,752,736 | 6/1988 | Arakawa et al. | 324/318 |
| 4,887,039 | 12/1989 | Roemer et al. | 324/322 |

*Primary Examiner*—Michael J. Tokar
*Attorney, Agent, or Firm*—Antonelli, Terry, Stout & Kraus

[57] ABSTRACT

RF coils for a nuclear magnetic resonance device having following features separated or combined at an intersecting portion of two conductive loops disposed so that sensitive directions thereof are substantially perpendicular to a direction of a static magnetic field and that the conductive loops intersect each other with a predetermined interval; (1) conductors of conductive loops are narrowed; (2) neighborhood of intersecting portion is grounded; and (3) a member having a small dielectric constant is put inside of an intersecting portion.

21 Claims, 10 Drawing Sheets

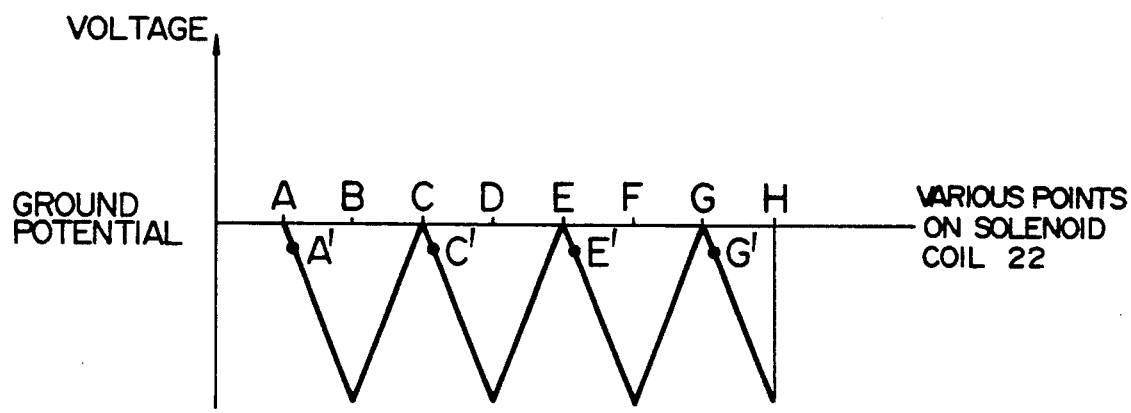
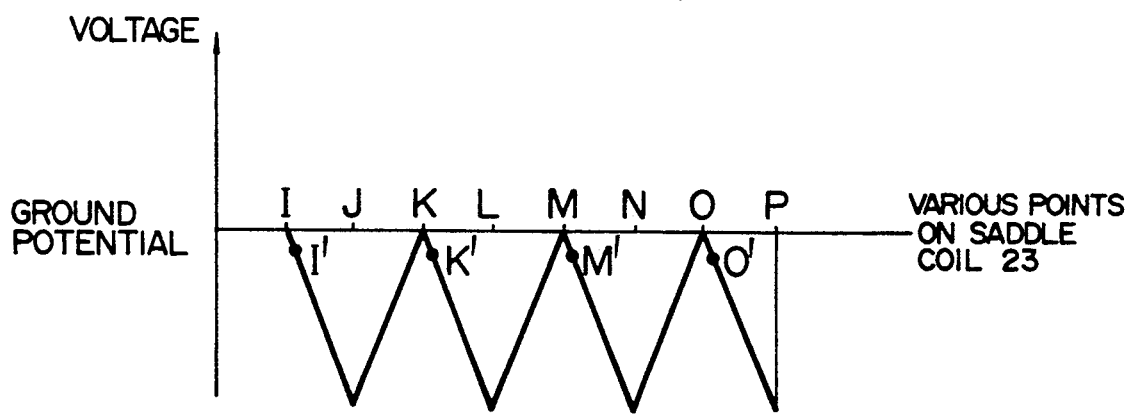

RF COIL FOR A NUCLEAR MAGNETIC RESONANCE IMAGING DEVICE

BACKGROUND OF THE INVENTION

The present invention relates to an RF coil used in a transmitting or receiving system for a nuclear magnetic resonance (hereinbelow abbreviated to NMR) imaging device for obtaining a tomographic image of a desired portion of a body to be examined (human body) utilizing NMR phenomena, in which sensitive directions of two conductive loops intersect perpendicularly to each other, forming a pair, and inparticular to an RF coil for an NMR imaging device capable of reducing coupling between the two conductive loops described above.

An NMR imaging device is composed of magnetic field generating means giving a static magnetic field and a gradient magnetic field in a direction perpendicular to the body axis of a body to be examined; a transmitting system for irradiating the body, to be examined with an RF signal in order to produce NMR in nuclei of atoms constituting living body structure thereof; a receiving system for detecting an RF signal emitted by the NMR described above; and a signal processing system performing an image reproducing operation, using the RF signal detected by this receiving system. It was so constructed that a RF signal having a frequency capable of exciting NMR was applied to a body to be examined by means of the RF coil in the transmitting system, while giving a uniform static magnetic filed thereto by using the static magnetic field generating means and an NMR signal emitted by the body to be examined in this way was detected by the RF coil in the receiving system. At this time, in order to specify the position, where the NMR signal was emitted by the body to be examined described above, imaging was effected by giving further a gradient magnetic field by using the gradient magnetic field generating means.

As an RF coil in such an NMR imaging device, heretofore there was known a coil, in which one conductive loop, e.g. a solenoid coil or a saddle coil was used, which received the NMR signal in one direction. On the contrary, there was known another coil, in which two conductive loops intersected so that sensitive directions there of were perpendicular to each other, forming a pair which received the NMR signal in two directions. The sensitive direction is in accordance with the direction, in which the magnetic field is generated. The latter RF coil consisting of combined two conductive loops is called, Quardrature Detection Coils, hereinbelow abbreviated to QD coils. As a prior art QD coil, a combination of a saddle coil with another saddle coil has been proposed e.g. for an NMR imaging device by the horizontal magnetic field method, in which the static magnetic field is generated parallely to the body axis of a human body. However, when the combination of a saddle coil with another saddle coil was used, in particlar in an NMR imaging device by the vertical magnetic field method, in which the staic magnetic field is generated in the up- and downward direction, the direction of the static magnetic field was in accordance with the reception direction and it was impossible to receive the signal with a high sensitivity. Therefore, recently a combination of a solenoic coil with a saddle coil has been proposed e.g. for the QD coil by the vertical magnetic field method.

However, in such a prio art RF coil, in particular in a QD coil by the vertical magnetic field method, since it was a combination of two different coils such as a solenoid coil and a saddle coil, it happened that coupling was produced between the different coils. Here the coupling means that when an RF current flows through one of the coils, the RF current leaks to the other coil and magnetic filed is produced further by the leak current. When such a coupling is produced, each of the coils is a lood of the other and acts as loss for each coil. This lowered the sensitivity of the RF coil as a whole. Therefore it was caused that the S/N ratio of the obtained image was lowered.

Here, as a cause of the coupling between the RF coils described above, capacitive coupling, by which parasitic capacitance is produced between the two coils due to the fact that the interval there between at the intersection is as small as several mm and current flowing through one of them leaks to the other, and inductive coupling, by which unbalance is produced with respect to the magnetic flux of one of the coils by the magnetic flux generated by the other, are conceivable. The inductive coupling can be reduced by adjusting the unbalance in the magnetic flux by disposing a plate made of a conductive material, e.g. copper, in the proximity of the coils and therefore it gives rise to no serious problem. On the other hand, the capacitive coupling can be reduced by decreasing parasitic capacitance formed between the coils by increasing the interval therebetween at the intersection. That is, when two plane conductive plates $A_1$ and $A_2$ are located closely and parallelly to each other (corresponding to the intersecting portion of the two coil conductors), as indicated in FIG. 5, denoting the interval between the two plates $A_1$ and $A_2$ by d, the area of the plane conductive plates $A_1$ and $A_2$ by S, and the dielectric constant of the space therebetween by $\epsilon$, the electric capacitance between the two plane conductive plates $A_1$ and $A_2$ described above is given by;

$$C = \frac{\epsilon S}{d} \quad (1)$$

As clearly seen from this Eq (1), the electric capacitance C between the two plane conductive plates $A_1$ and $A_2$ is decreased by increasing the interval d therebetween.

Consequently, heretofore, the capacitive coupling was reduced by decreasing parasitic capacitance formed by the two coils by increasing the interval therebetween at the intersection. However, in this case, the interval between the two coils should be increased with increasing NMR frequency and thus the whole sige of the RF coils was increased. Further the distance of at least one of the coils was great from the body to be examined which lowered further the sensitivity and worsened the S/N ratio.

SUMMARY OF THE INVENTION

The object of the present invention is to provide RF coils for an NMR imaging device capable of solving the problems described above and reducing the coupling between the two conductive loops (coils).

In order to achieve the above object the RF coils according to the present invention have following features separated or combined. A first feature is that the potential of the two conductive loops described above at the intersection is set so as to close to the ground potential. By constructing them as described above, electric charge stored by the parasitic capacitance is reduced. As the result, working voltage at the intersecting portion described above is lowered. In this way, even if the interval at the intersecting portion remains to be equal to that used heretofore, it is possible. To reduce the coupling therebetween by alleviating the capacitive coupling. A second feature is that the area of the two conductive loops at the intersection, which are opposite to each other, is reduced by decreasing the width of the conductors. By constructing them as described above, it is possible to reduce the parasitic capacitance formed at the intersecting portion. In this way it is possible to alleviate the capacitive coupling and to reduce the coupling between the two conductive loops without increasing the interval therebetween at the intersecting portion.

A third feature is that the interval at the intersecting portion is kept by putting a member having a small dielectic constant at the intersecting portion of the two conductive loops described above.

In the RF coils according to the present invention it is necessary to maintain the interval at the intersecting portion of the two conductive loops constituting them and for this reason a certain material is put therebetween at the intersecting portion. However, if a material having a great dielectric constant $\epsilon$ is put therebetween, the parasitic capacitance C formed therebetween is great according to Eq.(1). Consequently the parasitic capacitance formed at the intersecting portion described above is kept to be small by putting a material having a small dielectric constant therebetween at the intersecting portion while maintaining the interval at the intersecting portion.

BRIEF DESCRIPTION OF THE DRAWINGS

FIGS. 7A and 7B indicate working voltages applied to the RF coils indicated in FIG. 6;

DESCRIPTION OF THE PREFERRED EMBODIMENTS

Figure 1:
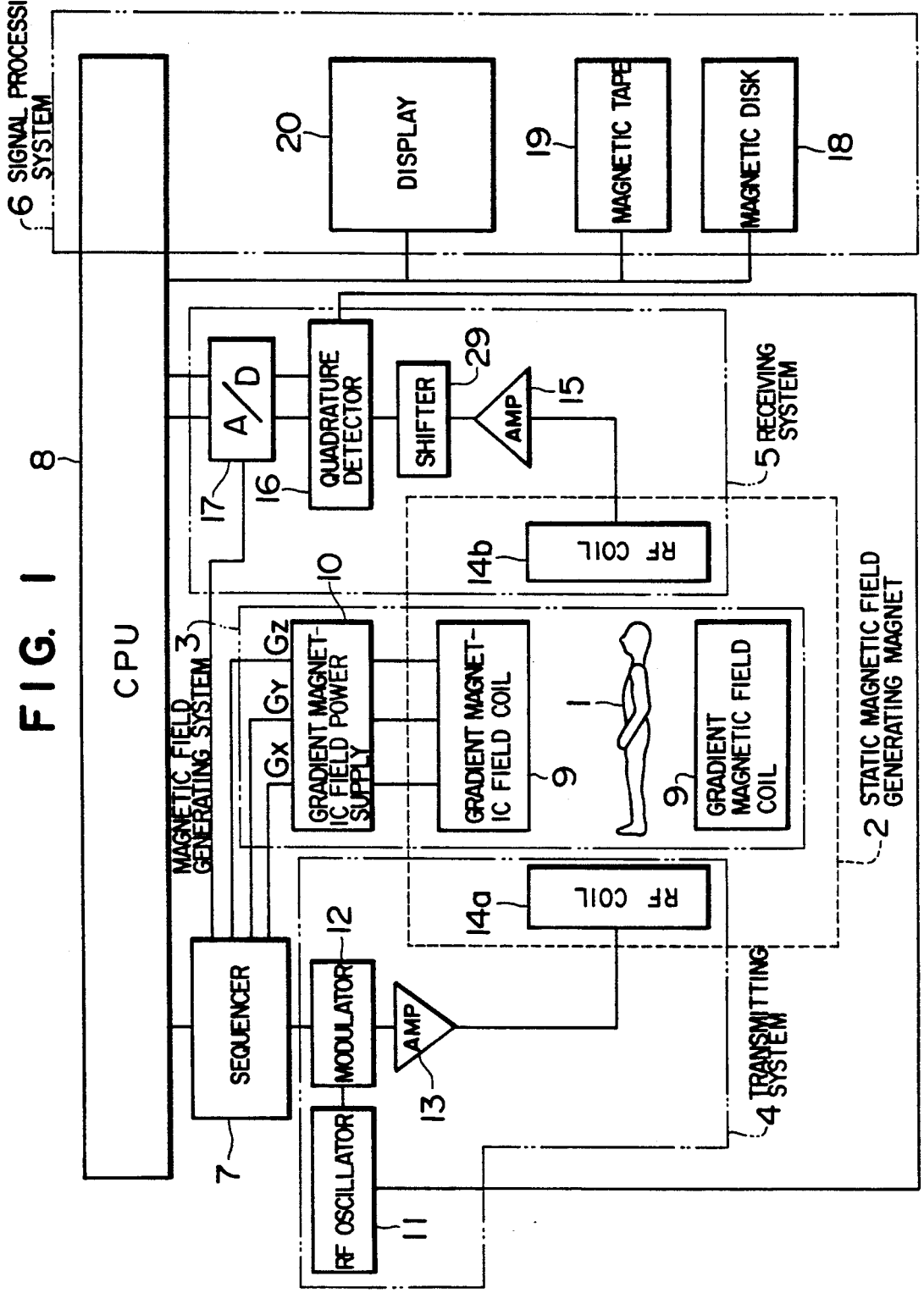
FIG. 1 is a block diagram showing the whole construction of an NMR imaging device to which RF coils according to the present invention are applied.

FIG. 1 is a scheme showing the whole construction of an NMR imaging device using RF coils according to the present invention, which is composed of a static magnetic field generating magnet 2; a gradient magnetic field generating system 3; a transmitting system 4; a receiving system 5; a signal processing system 6; a sequencer 7; and a central processing unit (CPU) 8.

The static magnetic field generating magnet 2 stated above generates a uniform static magnetic field in the direction of the body axis or in the direction perpendicular to the body axis around a body to be examined 1. Magnetic field generating means of permanent magnetic type or resistive magnetic type or superconducting magnet type is disposed in a space having a certain extent around the body to be examined 1 stated above. The gradient magnetic field generating system 3 consists of gradient magnetic field coils 9 wound in the three directions X, Y and Z of a Cartesian coordinate system and a greadient magnetic field power supply 10 driving the different coils so that gradient magnetic fields $G_x$, $G_y$ and $G_z$ are applied to the body to be examined 1 in the three directions of X, Y and Z by driving the gradient magnetic field power supply 10 for the different coils according to an instruction from the sequencer 7 stated above. It is possible to set an arbitrary slice face with respect to the body to be examined 1 by varying how to apply these gradient magnetic fields.

The transmitting system 4 irradiates the body to be examined 1 with an RF signal (electromagnetic wave) in order to make nuclei of atoms constituting a living body texture thereof generate NMR. It consists of an RF oscillator, a modulator 12, an RF amplifier 13 and a transmitter side RF coil 14a. It is so constructed that the body to be examined 1 is irradiated with electromagnetic wave by amplitude-modulating RF pulses outputted by the RF oscillator 11 stated above by means of the modulator 12 according to an instruction coming from the sequencer 7 and supplying these amplitude-modulated RF pulses to the RF coils 14a disposed closely to the body to be examined 1 after having been amplified by the RF amplifier 13. The receiving system 5 detects RF signals (NMR signals) emitted by NMR by nuclei in the living body texture of the body to be examined 1. It includes a receiver side RF coil 14b; an amplifier 15; a shifter 29; a quadrature detector 16; and an A/D converter 17. The RF signals (NMR signals), response of the body to be examined 1, using electromagnetic wave emitted by the transmitter side RF coil 14a, are detected by the RF coil 14b disposed closely to the body to be examined 1 and inputted in the A/D converter 17 through the amplifier 15, the shifter 29 and the quadrature detector 16, where they are converted into digital signals. Further they are transformed into two series of collected data sampled by the quadrature detector 16 with timing by an instruction from the sequencer 7 and the signals thus obtained are sent to the signal processing system 6.

This signal processing system 6 consists of a CPU 8, a recording device such as a magnetic disk 18, a magnetic tape 19, etc. and a display 20 such as a CRT, etc. The CPU stated above performs processings such as Fourier transformation, correction coefficient calculation image reconstruction, etc. The system is so constructed that a signal intensity distribution on an arbitray cross-secion or a distribution obtained by performing suitable operations on a plurality of signals is imaged and displayed in the form of a tomographic image on a display 20. The sequencer 7 is operated under the contol of the CPU 8 to transmit various instructions necessary for collecting data of the tomographic image of the body to be examined 1 to the transmitting system 4. The gradient magnetic field generating system 3 and the receiving system 5 and it serves as means for generating a sequence for measuring the NMR signal described previously. In FIG. 1, the transmitter side RF coil 14a, the receiver side RF coil 14b and the gradient magnetic field coils 9 are disposed within the magnetic field space of the static magnetic field generating magnet 2 located in the space around the body to be examined 1.

Now the RF coils according to the present invention will be explained. According to the present invention, e.g. the receiver side RF coil 14b is composed of a pair of two conductive loops, whose sensitive directions are perpendicular to each other and located so that the reception direction, where RF signals emitted by the NMR from the body to be examined 1 are detected, is perpendicular to the static magnetic field generated by the static magnetic field generating magnet 2.

In the first embodiment, the area of the two conductive loops, which are opposite to each other, is kept to be small by reducing the width of the conductors at the intersecting portion thereof.

Figure 5:
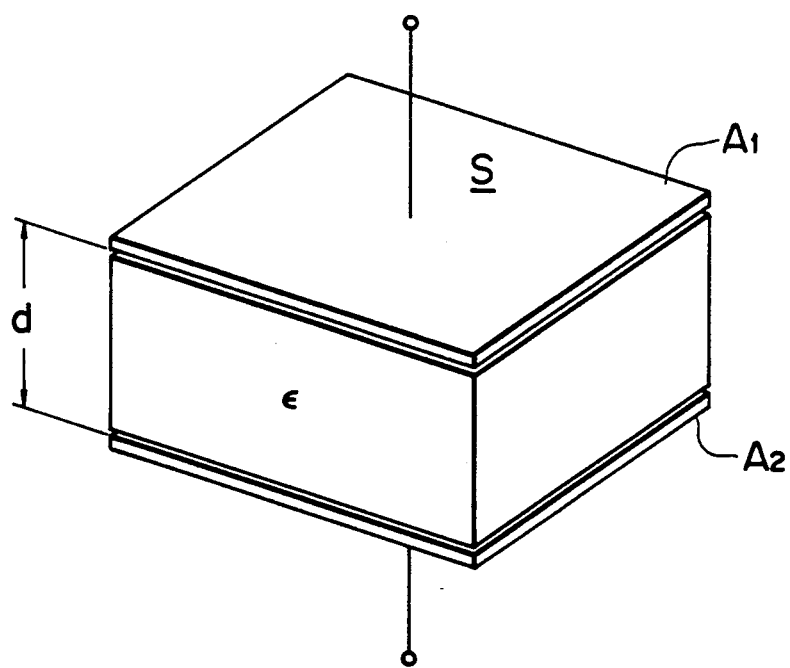
FIG. 5 is a scheme for explaining electric capacitance between two plane conductive plates disposed closely and parallelly to each other.

That is, a solenoid coil 22 having a sensitive direction $P_1$ is wound as one of the conductive loops in the peripheral direction on the outer surface of a cylindrical bobbin 21 made of resin. On the other hand, a saddle coil 23 having a sensitive direction $P_2$ serving as the other conductive loop is disposed so that the reception direction thereof is perpendicular to the reception direction of the solenoid coil 22 described above. Each of the coils 22 and 23 is divided by a capacitor 24 so as to lower the working voltage. The saddle coil 23 described above protrudes outwards in the longitudinal direction of the bobbin 21 made of resin described above by deforming coil members 23a and 23b located on one side of the bobbin 21 made of resin, in order to increase the reception sensitivity of the part corresponding to the head of the body to be examined 1 inserted within the RF coil 14b. Further, there is disposed an interval of e.g. about 6 mm at the intersecting portion 25 of the solenoid coil 22 and the saddle coil 23 in order to alleviate the capacitive coupling between the two coils, as described previously. In addition, in order to reduce further the capacitive coupling between the two coils, the conductors are narrowed at the intersection portion 25 so that the area where they are opposite to each other is small. Since this means that the area S of the plane conductive plates $A_1$ and $A_2$ in FIG. 5 is reduced, the electric capacitance C therebetween is also reduced, as clearly seen from Eq.(1) described above. Consequently the parasitic capacitance formed between the two coils 22 and 23 is reduced and it is possible to alleviate the capacitive coupling therebetween.

Figure 2:
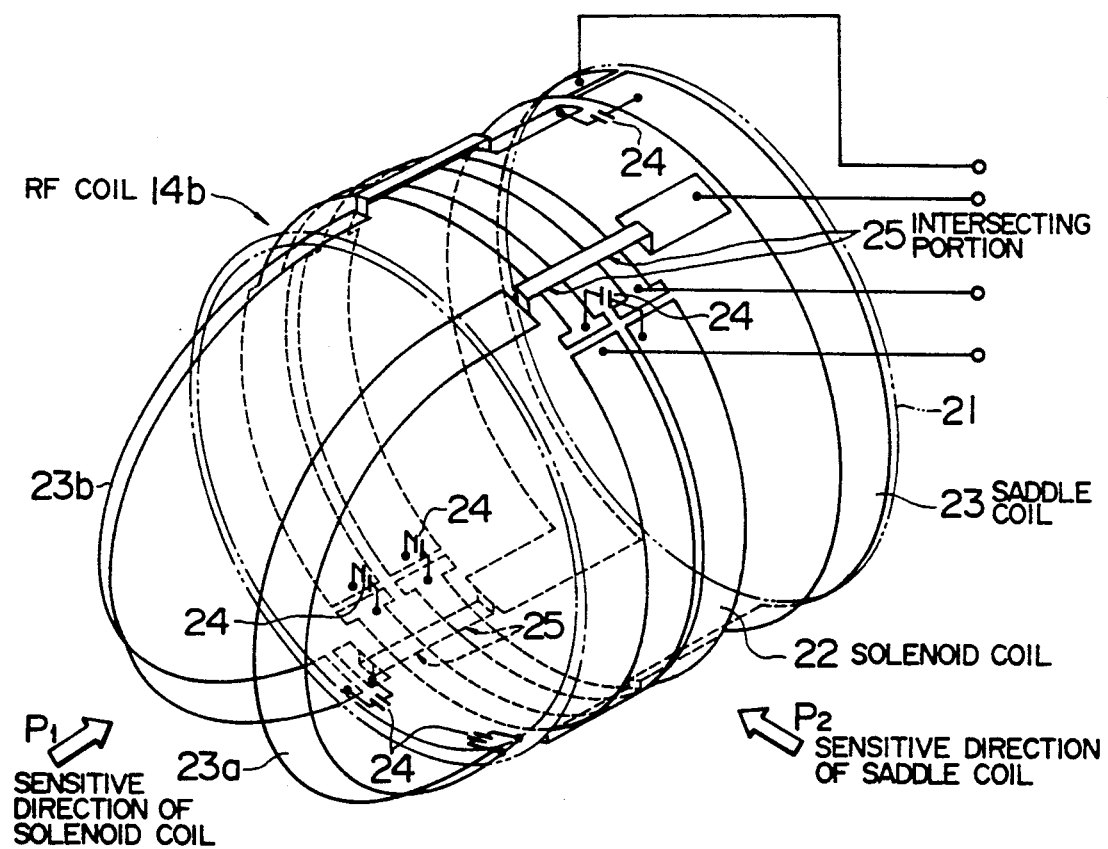
FIG. 2 is a perspective view showing an embodiment of the RF coils according to the present invention.

According to experimental confirmation by the inventors of the present invention, it is desirable that the area at the intersecting portion 25, where the two coils 22 and 23 are opposite to each other is e.g. 100 to 400 mm$^2$. If the area is smaller than this value, it gives rise to lowering in the sensitivity (lowering in the S/N ratio) and on the contrary, if the area is greater than that, the capacitive coupling is so great that they cannot be used in practice. However the value described above varies, depending on the resonance frequency of the used NMR imaging device, and thus the present invention is not limited to the numerical value described above. Further, although in the example indicated in FIG. 2, the conductors are narrowed continuously from one intersecting portion to the succeeding intersection portion 25 both for the solenoid coil 22 and for the saddle coil 23, the present invention is not limited thereto, but the two coils 22 and 23 may be narrowed only at the part, where they intersect really each other. The conductors of both the solenoid coil 22 and the saddle coil 23 are not narrowed at the intersecting portion 25, but only the conductor of either one of the coils may be narrowed. In this case, it is necessary to reduce further the width of the conductor of the narrowed either one of the coils with respect to the width in the case where the conductors of both the coils are narrowed. Still further, although, in FIG. 2 the saddle coil 23, which is to be combined with the solenoid coil 22, is deformed by protruding outwards the coil members 23a and 23b located on one side thereof, the present invention is not limited thereto, but a coil having a usual shape, e.g. including coil members 23a' and 23b', which are bent in the peripheral direction of a bobbin 21 at the two extremities, may be used.

Figure 4:
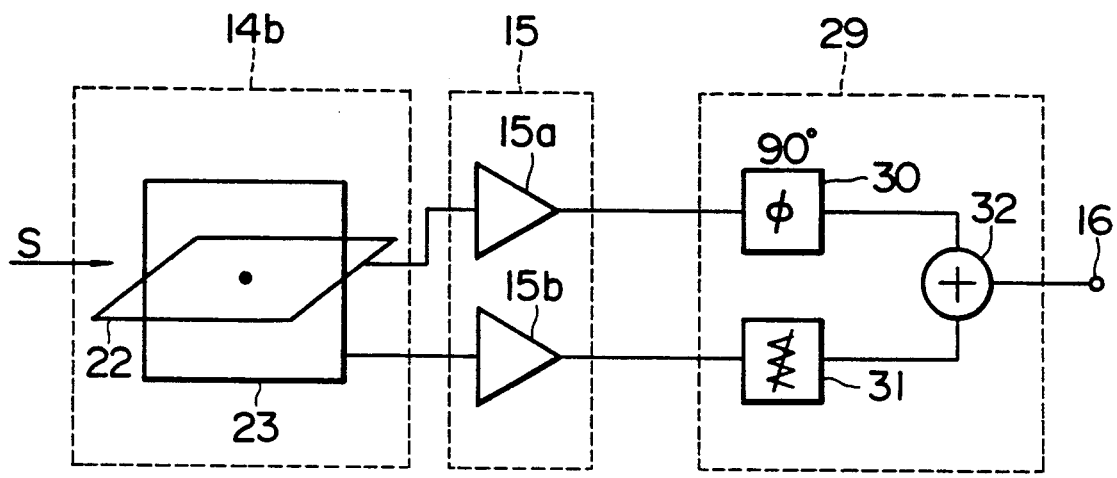
FIG. 4 is a diagram indicating connection of the RF coils according to the present invention.

FIG. 4 is a circuit diagram indicating the connection for the first embodiment of the RF coil 14b. For the sake of the simplification of the explanation, the tuning circuit for the coil, etc. are omitted in the figure. In the figure, the direction of the static magnetic field is indicated by an arrow S and a magnetizing vector rotating on one plane induces same signals accompanied by a phase difference of 90° in the solenoid coil 22 and the saddle coil 23 constituting the RF coil 14b. Here, since the solenoid coil 22 and the saddle coil 23 are so disposed that the sensitive directions thereof are perpendicular to each other, RF signals (NMR signals) are detected, accompanied by random noises independent from each other. What can be sources of these noises is the resistances of the coils 22 and 23 and the body to be examined 1, which can be considered as a resistance in a magnetic circuit due to the magnetic coupling and the electric coupling with these coils 22 and 23. Since a human body acts as a load for the coil, it can be considered as a resistance.

Signals from the solenoid coil 22 and the saddle coil 23 are imputted in the shifter unit 29 after having been amplified by a first amplifier 15a and a second amplifier 15b in the amplifier 15. This shifter unit consists of a phase shifter 30, an attenuater 31 and an adder 32. The phase of the signal coming from the solenoid coil 22 is shifted by 90° by the phase shifter 30 stated above so as to be in accordance with the phase of the signal coming from the saddle coil 23. On the other hand, the saddle coil 23 and the solenoid coil 22 have sensitivities different from each other. For example assuming that the sensitivity of the former is "1", that of the latter is, in general, "1.4". Consequently it is impossible to obtain any high S/N ratio, unless the addition ratio for the different signals by means of the adder 32 differs from 1. At this time, the most suitable addition ratio, with which the highest S/N ratio can be obtained, is empirically $.1^2 \div 1.4^2 = 0.51$. Therefore the attenuator 31 is inserted in the course of the signal path from the saddle coil 23 and it is so ajusted that, assuming that the signal from the solenoid coil 22 is "1", the signal from the saddle coil 23 is "0.51". The two signals are added by the adder 32 after having made the signal intensities from the two coils 22 and 23 conform to each other and outputted from the shifter 29. The output signal from the shifter 29 is sent to the quadrature detector 16 indicated in FIG. 1.

When the phases of the signals coming from the two coils 22 and 23 are made conform to each other by means of the phase shifter 30 and added by the adder 32, as explained above, using $$\frac{S_1 + S_2}{\sqrt{N_1^2 + N_2^2}} = S/N$$

where $N_1$ and $N_2$ are values of noise components, and $S_1$ and $S_2$ are values of signal components, although noise is somewhat in ereased, the detected signals are considerably increased and as the result, the S/N ratio is improved. For example, in the case where the size sand the shapes of one of the coils and the other are equal to each other and the equivalent resistances of the body to be examined 1 are equal, the detection signals are multiplied by 2 and the noise by $\sqrt{2}$. As the result, the S/N ratio is improved by a factor of $\sqrt{2}$.

Figure 6:
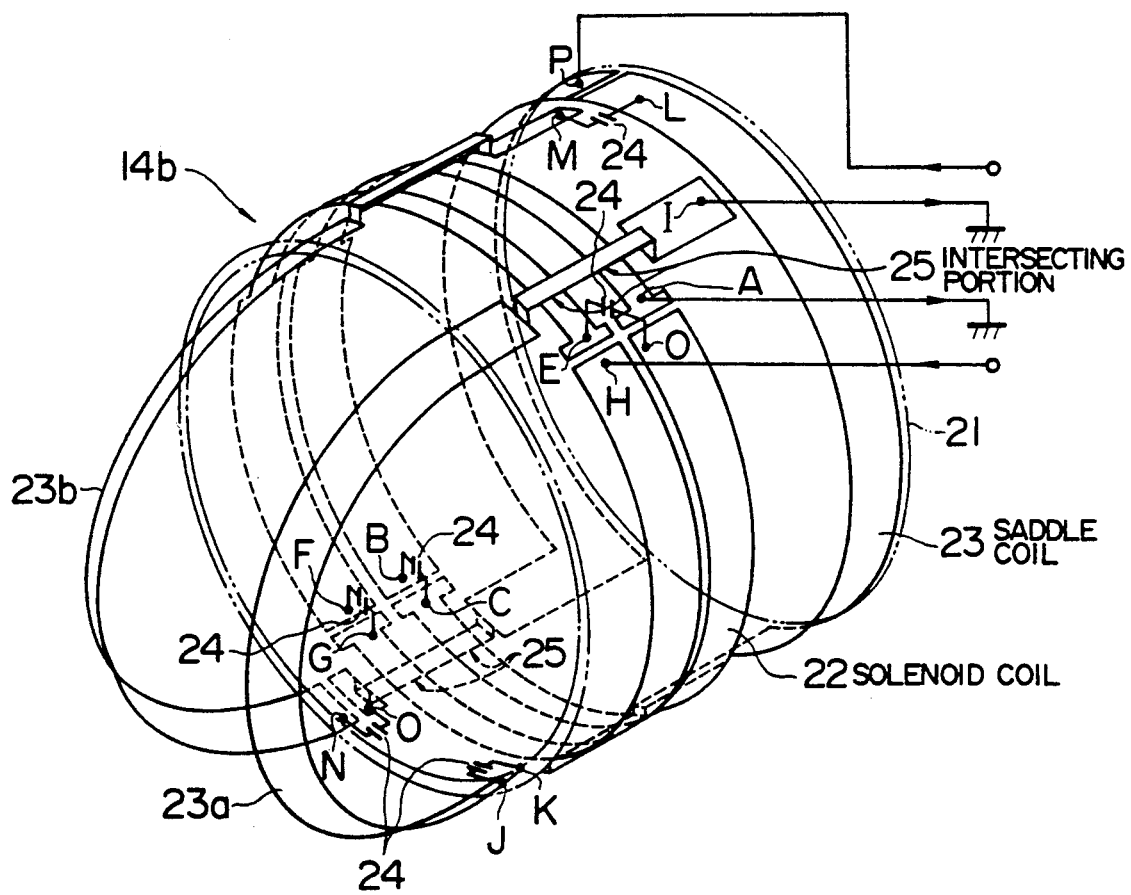
FIG. 6 is a perspective view showing another embodiment of the RF coils according to the present invention.

FIG. 6 is a scheme showing the second embodiment of the RF coils according to the present invention. The present embodiment is so constructed that the potentials of the intersecting portions 25 of the two conductive loops are close to the ground potential of the different conductive loops. Although the construction is basically identical to that indicated in FIG. 2, one side of the receiving lines is grounded.

In FIG. 6, feeding points and capacitor dividing points for the solenoid coil 22 and feeding points and capacitor dividing points for the saddle coil 23 are so determined that the potential of the intersecting portion between the solenoid coil 22 and the saddle coil 23 is close to the ground potential. That is, in the neighborhood of the intersecting portion 25 in FIG. 6, the feeding points for the solenoid coil 22 are set at A-H; the capacitor dividing points therefor are set at B-C, E-D, F-G; the feeding points for the saddle coil 23 are set at I-P; and the capacitor dividing points are set at J-K, L-M, O-N. In the embodiment indicated in the figure these points A and I are connected with the ground. In this way, the amount of charge stored in the parasitic capacitance is reduced and consequently the working voltage of the coils 22 and 23 is lowered. As the result, the capacitive coupling at the intersecting portion 25 between the solenoid coil 22 and the saddle coil 23 can be reduced.

The circuit diagram indicating the connection for the RF coil 14b thus constructed is identical to that indicated in FIG. 4. FIGS. 7A and 7B are graphs indicating the warking voltage including the phase of the RF coil 14b constructed as described above. Between them FIG. 7A indicates the working voltage of the solenoid coil 22 and FIG. 7B indicates the working voltage of the saddle coil 23. Since the point A on the solenoid coil 22 is connected with the ground, as indicated in FIG. 6, it is at the ground potential. The voltage in the region from the point A to the point B on the solenoid coil 22 is lowered by the impedance component $j\omega_L$ of the coil member, as indicated in the figure. Next, in the region from the point B to the point C, since each of the conductors is divided by a capacitor 24 as indicated in FIG. 6, the voltage across it is represented by a impedance component $$-j\frac{1}{\omega c}.$$

Since the phase of the voltae across the capacitor is shifted by 180° with respect to that of the impedance component $j\omega_L$, the voltage is raised as indicated in the figure to return again to the ground potential. Subsequently, in the region from the point C to the point D, the voltage is lowered again by the impedance component $j\omega_L$ of the coil member. Further, in the region from the point D to the point E, since each of the conductors is divided by a capacitor 24, the voltage is raised to return again to the ground potential. Thereafter, at the point H, at which the signal is taken out after having repeated the process described above, the voltage is in a lowered state. At this time, since the point A on the solenoid coil 22 is grounded, as described in FIG. 6, the potential at a point A' located in the intersecting portion 25 between the solenoid coil 22 and the saddle coil 23, which is in the neighborhood of the point A, is close to the ground potential of the solenoid coil 22. Similarly the potential at points C', E' and G' located in other intersecting portions 25 is also close to the graund potential, as indicated in FIG. 7A.

Further, in FIG. 7B, since the point I on the saddle coil 23 is grounded, as indicated in FIG. 6, it is at the ground potential. In the region from the point I to the point J on this saddle coil 23, the voltage is lowered by the impedance component $j\omega_L$ of the coil member, as indicated in the figure. Next, in the region from the point J to the point K, since each of the conductors is divided by a capacitor 24 as indicated in FIG. 6, the voltage is raised as indicated in the figure to return again to the ground potential.

Thereafter, in the same way as in the case indicated in FIG. 7A described above, the boltage is repeatedly raised and lowered and at the point P, at which the signal is taken out, the voltate is in a lowered state. At this time, since the point I on the saddle coil 23 is grounded, as described in FIG. 6, the potential at a point I' located in the intersecting portion 25 between the solenoid coil 22 and the saddle coil 23, which is in the neighborhood of the point I, is close to the ground potential of the saddle coil 23. Similarly the potential at points K', M' and O' located in other intersecting portions 25 is also close to the ground potential, as indicated in FIG. 7B.

Since the potential at points located in the intersecting portions 25 between the solenoid coil 22 and the saddle coil 23 is close to the ground potential, the parasitic capacitance between the two coils 22 and 23 is reduced and thus the capacitive coupling is alleviated.

Figure 8:
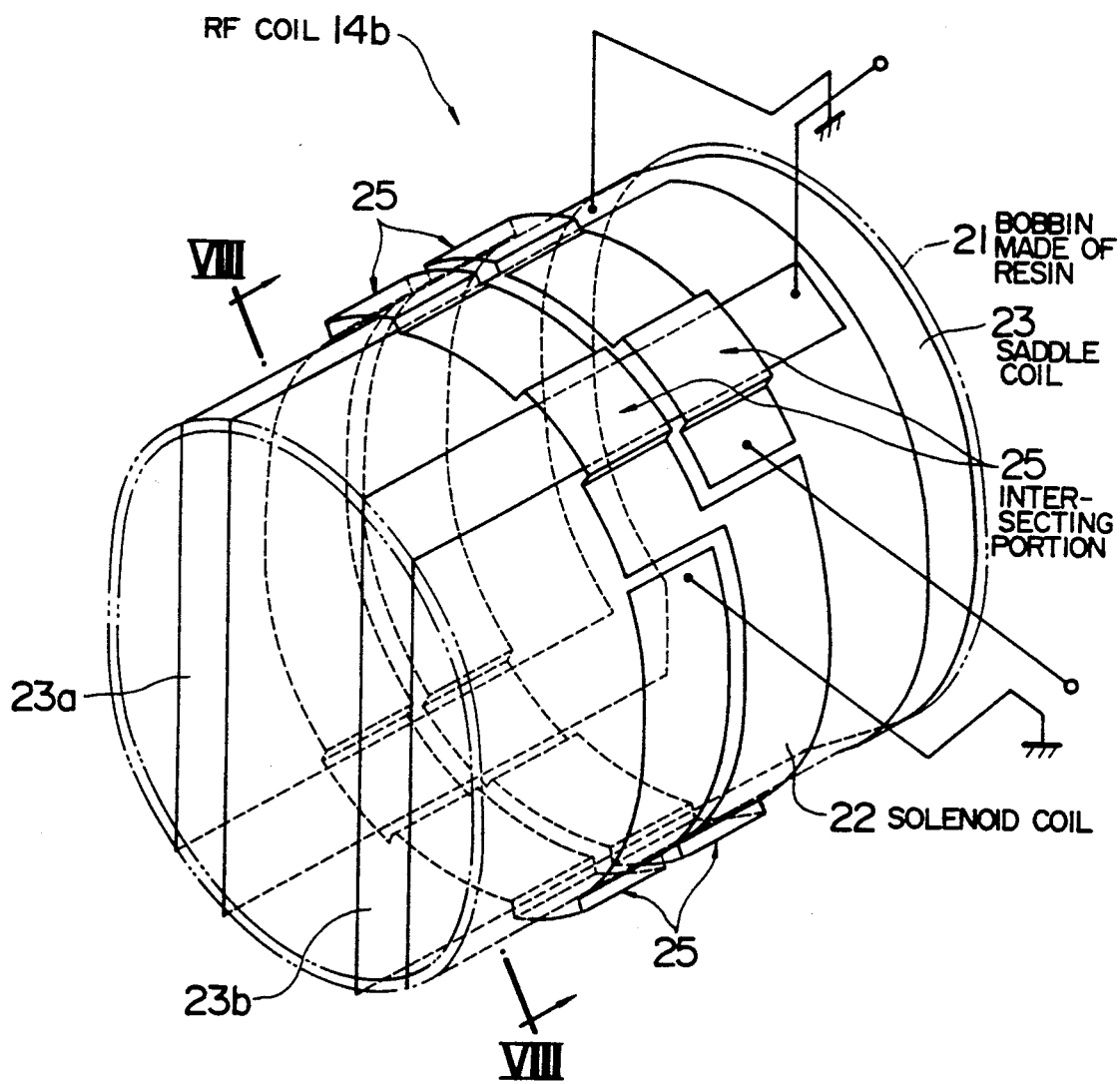
FIG. 8 a perspective view showing still another embodiment of the RF coils according to the present invention.
Figure 9:
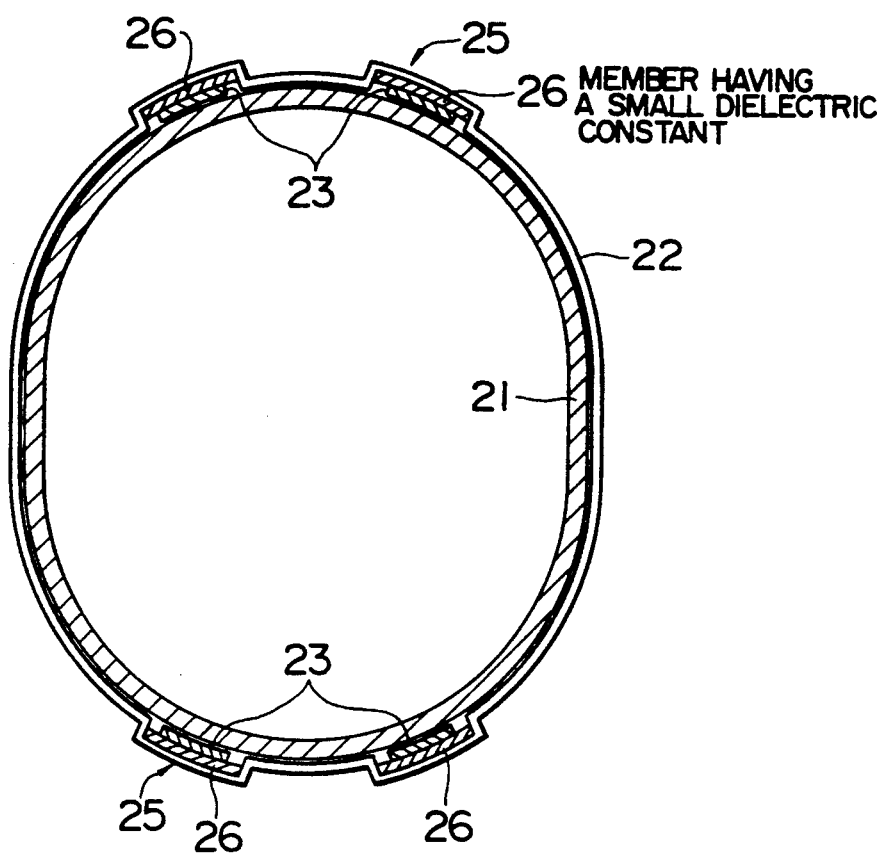
FIG. 9 is a cross-sectional view along a line VIII—VIII in FIG. 8.
Figure 10:
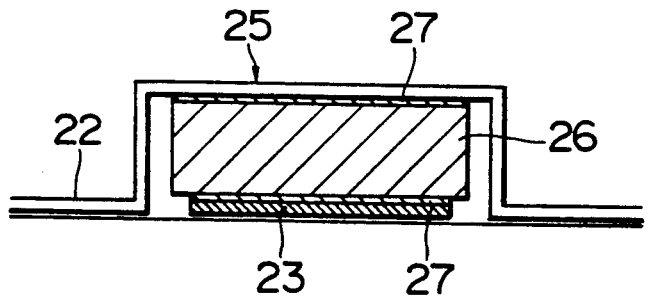
FIGS. 10 and 11 are cross-sectional views of a state, where a member having a small dielectic constant is fixed at the intersecting portion of the two coils.

FIG. 8 shows the third embodiment of the RF coils according to the present invention and FIG. 9 is a cross-sectional view along the line VIII—VIII in FIG. 8.

In the present embodiment a member having a small dielectric constant is put at the intersecting portion between the two conductive loops and the interval at the intersecting portion is maintained. In these RF coils, the solenoid coil 22 is wound spirally in the peripheral direction on the outer periphery of a cylindical bobbin 21 made of resin as one of the conductive loops and the saddle coil 23 is so disposed as the other conductive loop that the receiving direction thereof is perpendicular to the receiving direction of the solenoid coil 22. That is, the sensitive directions of the different coils is identical to $P_1$ and $P_2$ indicated in FIG. 2. The saddle coil 23 described above protrudes outwards in the longitudinal direction of the bobbin 21 made of resin described above by deforming coil members 23a and 23b located one side of the bobbin 21 made of resin, in order to increase the reception sensitivity of the part corresponding to the head of the body to be examined 1 inserted within the RF coil 14b. Further, there is disposed an interval of about 6 mm at the intersecting portion 25 of the solenoid coil 22 and the saddle coil 23, e.g. by protruding outwards the solenoid coil 22, in order to alleviate the capacitive coupling between the two coils, as described previously. A member 26 having a small dielectric constant is put at the intersecting portion 25 between the solenoid coil 22 and the saddle coil 23. The member 26 having a small dielectric constant 26 is shaped in the form of a plate made of e.g. teflon or polyethylene, having a predetermined thickness and put between the solenoid coil 22 and the saddle coil 23 on the inner side of the intersecting portion 25 thereof. Adhesive 27 is applied on the upper and lower surfaces thereof and it is fixed within the intersecting portion 25. In this case, it is necessary to use a material having a small dielectric constant for the adhesive 27 stated above. Further the fixation of the member 26 having a small dielectric constant described above may be effected by applying the adhesive 27 only to the two side portions on the upper and lower surfaces of the member 26 having a small dielectric constant and binding it is such a manner that the layer of the adhesive 27 is not superposed on the members of the solenoid coil 22 and the saddle coil 23. In this case, since the signal can be not influenced by the dielecvtric constant of the adhesive 27, it is unnecessary to use adhesive 27 having a particularly small dielectric constant.

Figure 12:
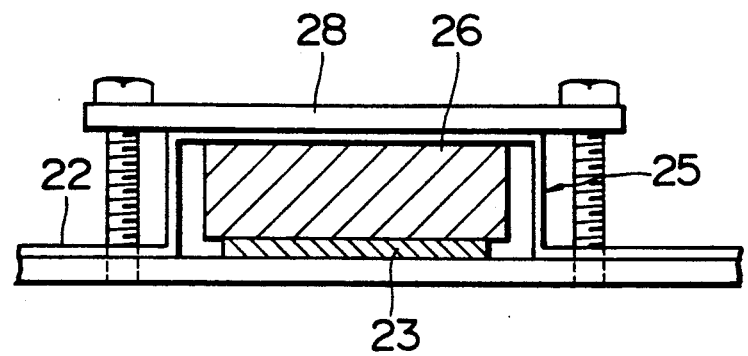
FIGS. 12 and 13 are a cross-sectional view and a plane view, respectively, of another example of the state, where the member having a small dielectric constant is fixed.
Figure 13:
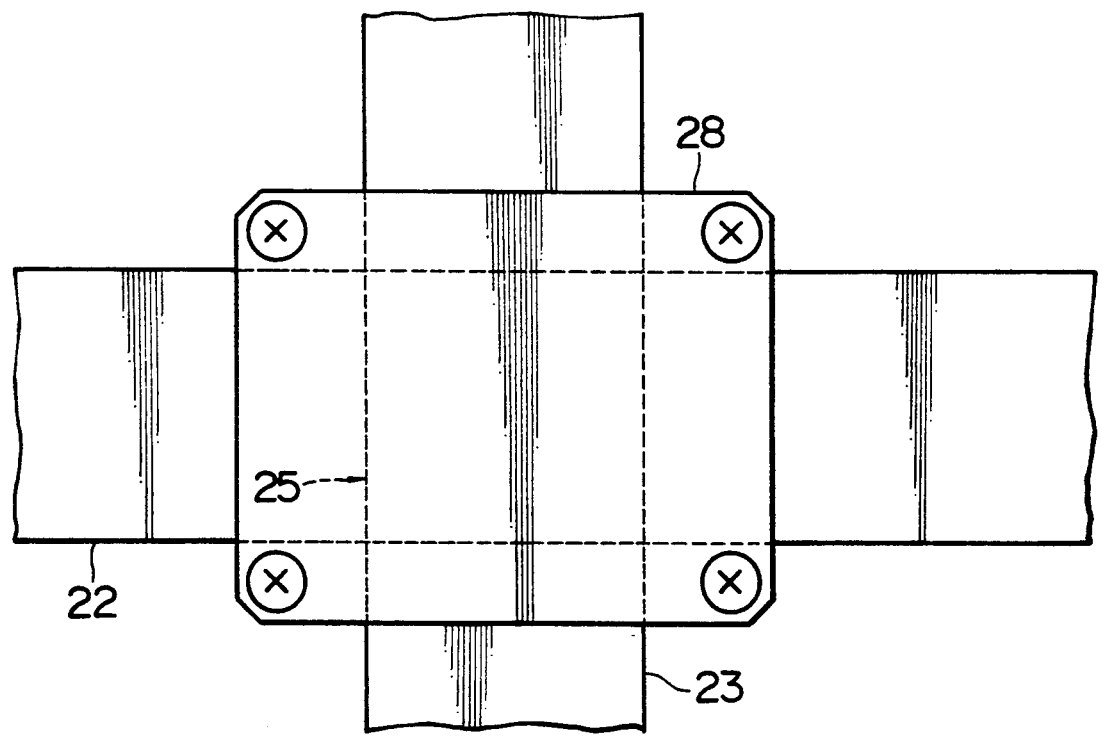

FIGS. 12 and 13 are a cross-sectional view and a plane view showing another example of the state of the fixed member 26 having a small dielectric constant. In this example, the member 26 having a small dielectric constant 26 is put between the solenoid coil 26 and the saddle coil 23 on the inner side of the intersecting portion 25 thereof; plate 28 shaped in a rectangular form made of resin is brought into contact with the upper surface of the intersecting portion 25; and the two coils 22, 23 and the member 26 having a small dielectric constant are thrusted and fixed by screwing the four corners thereof.

In the case where members 26 having a smalll dielectric constant are put between the solenoid coil 22 and the saddle coil 23 at the intersecting portions 25 thereof as described previously, this corresponds to the fact that the dielectric constant $\epsilon$ between the two plane parallel conductive plates $A_1$ and $A_2$ in FIG. 5 is reduced, as clearly seen from Eq.(1) stated previously the electric capacitance C therebetween is decreased. Consequently the parasitic capacitance produced between the two coils 22 and 23 is reduced and thus it is possible to alleviate the capacitive coupling therebetween.

Figure 3:
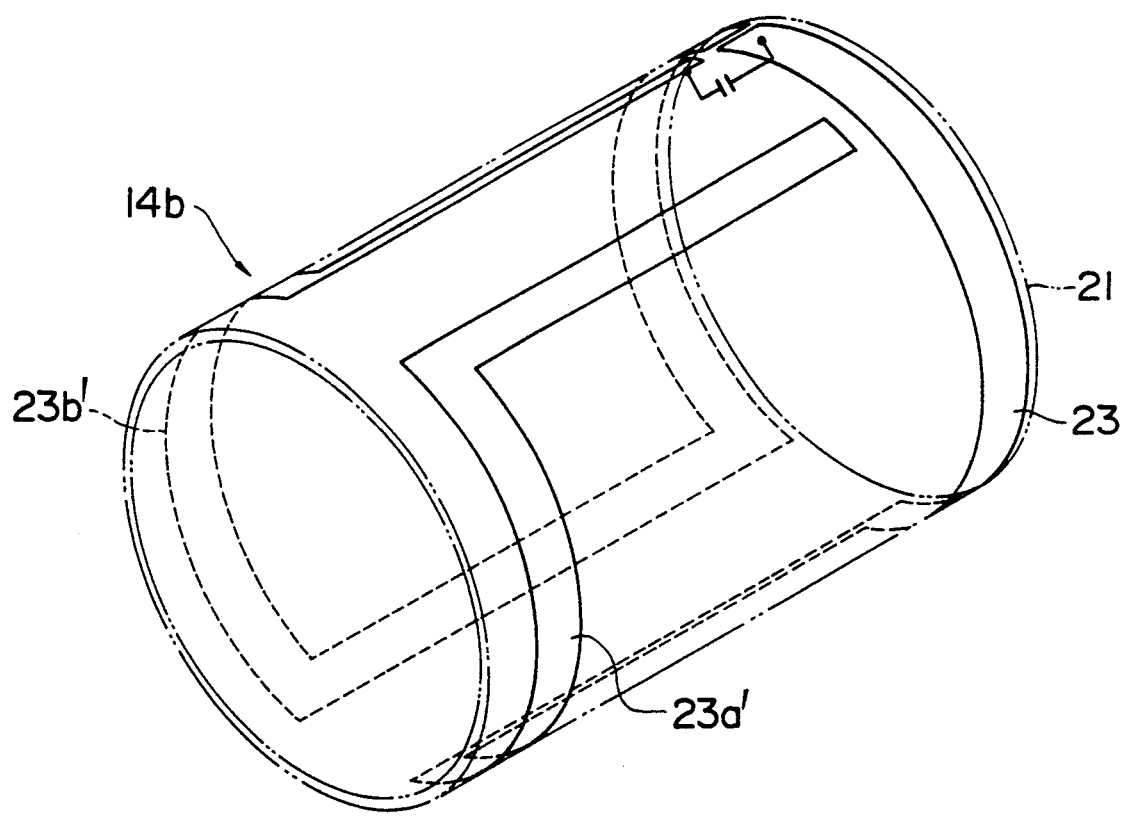
FIG. 3 is a perspective view showing the shape of a coil according to the present invention.

Although, in FIG. 8, an intersecting portion 25 between the solenoid coil 22 and the saddle coil 23, in which the interval is increased by protruding outwards the solenoid coil 22, is indicated, the present invention is not limited thereto, but the interval may be increased, on the contrary, by protruding outwards the saddle coil 23. Further, although, in FIG. 8, the saddle coil 23, which is to be conbined with the solenoid coil 22, is deformed by protruding outwards the coil members 23a and 23b located on one side thereof, the present invention is not limited thereto, but a solenoid coil having a usual form as indicated in FIG. 3 may be used.

The circuit diagram indicating the connection for the third embodiment of the RF coil 14b is identical to that indicated in FIG. 4.

According to the present invention, in order to alleviate the capacitive coupling, following features are realized, separated or combined, concerning the intersecting portion between the two conductive loops:
 (1) the conductors are narrowed;
 (2) the potential is close to the ground potential; and
 (3) the member having a small dielectric constant is put therebetween.

Figure 14:
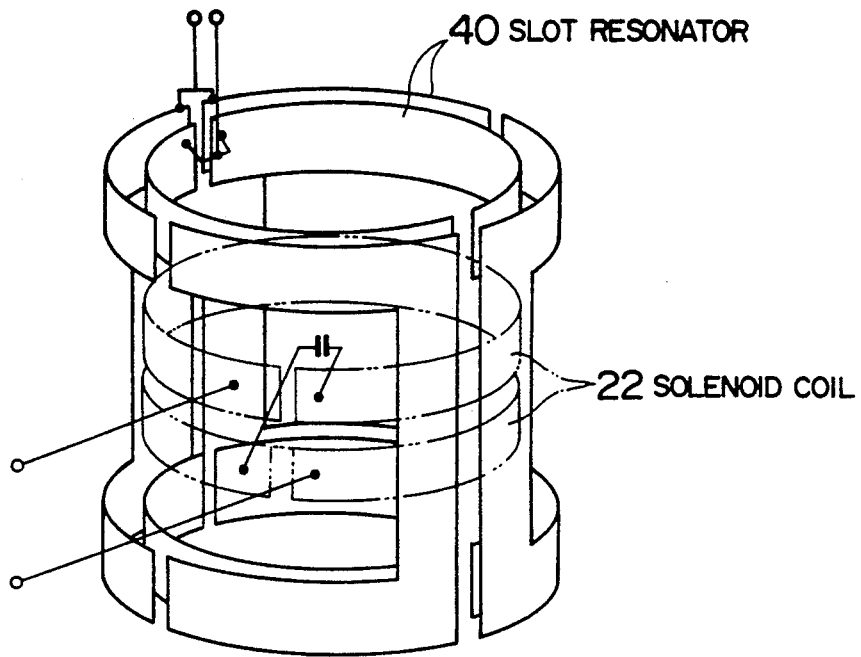
FIG. 14 is a perspective view showing another combination of the coils, to which the present invention can be applied.

Further, although, in the above explanation, a combination of a solenoid coil and a saddle coil is indicated as a QD coil of vertical magnetic field type, the present invention on can be applied also to a QD coil using a slot resonator 40 instead of the saddle coil, as indicated in FIG. 14.

Furthermore the present invention can be applied to two saddle coils 23 combined with each other for the QD coil for the NMR imaging device of horizontal magnetic field type.

Figure 15:
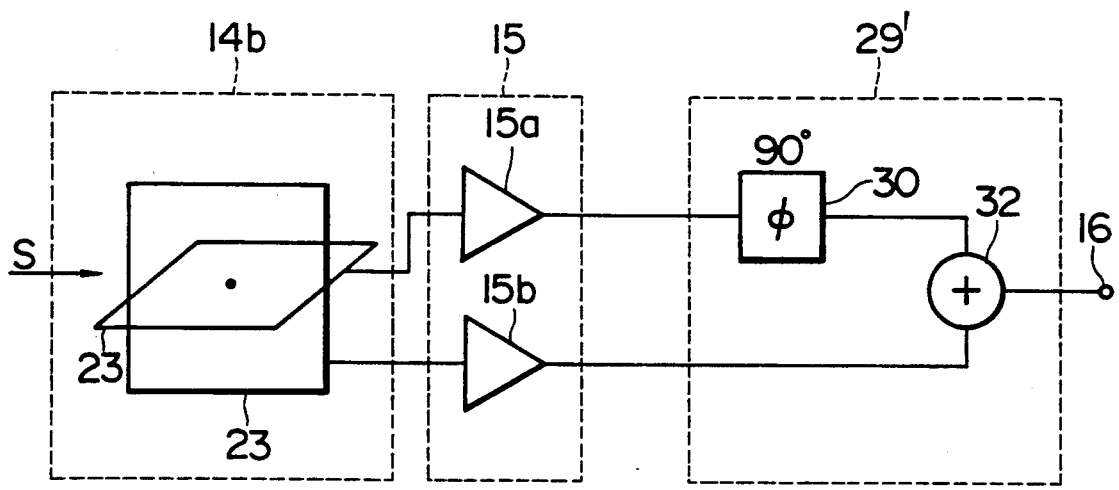
FIG. 15 is a diagram indicating connection of the RF coils according to another embodiment of the present invention.

The connecting circuit for the RF coils 14b in the case where saddle coils 23 and 23 having a same shape are combined is indicated in FIG. 15. At this time, since the two coils constituting the RF coil 14b is a combination of two saddle coils 23 and 23 having a same sensitivity, the addition ratio for the signals in the adder 32 in FIG. 4 can be 1:1. Consequently it is unnecessary to use the attenuator 31 for varying the addition ratio for the signals coming from the two coils as indicated in FIG. 4.

Figure 11:
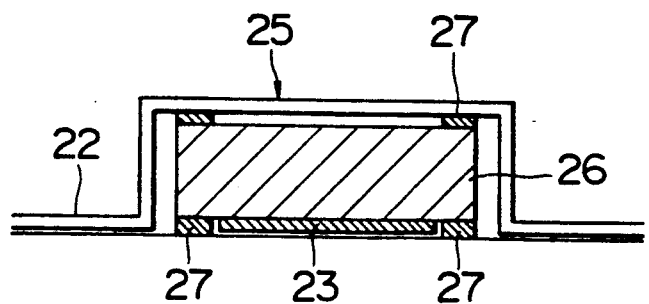

Further, although, in the above explanation, an example, in which the present invention is applied to the RF coil 14b on the receiver side in FIG. 11, has been described, the present invention is not limited thereto, but it can be applied also to the RF coil 14a on the transmitter side.

The present invention can be applied not only to the RF coils indicated in the above embodiments but also to various sorts of coils.

We claim:

1. RF coils for a nuclear magnetic resonance device having two conductive loops disposed so that sensitive directions thereof are substantially perpendicular to a direction of a static magnetic field and that said conductive loops intersect each other with a predetermined interval, in which said conductive loops have a small area at an intersecting portion where they are opposite to each other by a fact that a width of conductors is reduced, whereby parasitic capacitance at said intersecting portion is small so that coupling between said conductive loops is reduced.

2. RF coils according to claim 1, wherein each of said conductive loops is constructed by a plurality of conductive strips coupled by capacitors.

3. RF coils according to claim 1, wherein each of said conductive loops is constructed by a plurality of conductive strips coupled by conductors.

4. RF coils according to claim 1, wherein one of said conductive loops is a saddle coil and the other is a solenoid coil.

5. RF coils according to claim 4, wherein said interval is about 6 mm and said area at an intersecting portion where they are opposite to each other is 100–400 $mm^2$.

6. RF coils according to claim 1, wherein one of said conductive loops is a slot resonator and the other is a solenoid coil.

7. RF coils according to claim 1, wherein both said conductive loops are saddle coils.

8. RF coils for a nuclear magnetic resonance device having:
   two conductive loops disposed so that sensitive directions thereof are substantially perpendicular to a direction of a static magnetic field; and
   connecting points in a neighborhood of an intersecting portion where they are opposite to each other, with which an input or output signal line is connected, said connecting points being grounded;
   whereby potential of said intersecting portion is close to ground potential and as the result coupling between said two coils is reduced.

9. RF coils according to claim 8, wherein said conductive loops are so constructed that they are narrow at least at said intersecting portion.

10. RF coils according to claim 9, wherein said intersecting portion includes a member having a small dielectric constant put therebetween.

11. RF coils according to claim 8, wherein said intersecting portion includes a member having a small dielectric constant put therebetween.

12. RF coils according to claim 8, wherein each of said conductive loops is constructed by a plurality of conductive strips coupled by capacitors.

13. RF coils according to claim 8, wherein one of said conductive loops is a saddle coil and the other is a solenoid coil.

14. RF coils according to claim 8, wherein one of said conductive loops is a slot resonator and the other is a solenoid coil.

15. RF coils according to claim 8, wherein both said conductive loops are saddle coils.

16. RF coils for a nuclear magnetic resonance device having two conductive loops disposed so that sensitive directions thereof are substantially perpendicular to a direction of a static magnetic field and that said intersecting portion includes a member having a small dielectric constant is put at an intersecting portion between said two conductive loops so as to maintain an interval at said intersecting portion, whereby parasitic capacitance at said intersecting portion is small so that coupling between said conductive loops is reduced.

17. RF coils according to claim 16, wherein said member having a small dielectric constant is made of teflon or polyethylene.

18. RF coils according to claim 16, wherein one of said conductive loops is a saddle coil and the other is a solenoid coil.

19. RF coils according to claim 16, wherein one of said conductive loops is a slot resonator and the other is a solenoid coil.

20. RF coils according to claim 16, wherein both said conductive loops are saddle coils.

21. RF coils for a nuclear magnetic resonance device having following features separated or combined at an intersecting portion of two conductive loops disposed so that sensitive directions thereof are substantially perpendicular to a direction of a static magnetic field and that said conductive loops intersect each other with a predetermined interval, conductors of conductive loops are narrowed, neighborhood of intersecting portion is grounded and a member having a small dielectric constant is put inside of an intersecting portion.

* * * * *